United States Patent [19]
Tonella

[11] Patent Number: 5,883,963
[45] Date of Patent: Mar. 16, 1999

[54] METHOD OF ADJUSTING THE VOLUME AND THE LOUDNESS IN AN AUDIO DEVICE

[75] Inventor: Maurizio Tonella, Milan, Italy

[73] Assignee: SGS-Thomson Microelectronics S.r.l., Agrate Brianza, Italy

[21] Appl. No.: 974,597

[22] Filed: Nov. 19, 1997

[30]   Foreign Application Priority Data

Dec. 2, 1996   [IT]   Italy .................................. MI 96 A2517

[51] Int. Cl.$^6$ ....................................................... H03G 3/00
[52] U.S. Cl. ........................... 381/104; 381/109; 381/102
[58] Field of Search ............... 381/98, 101, 102, 381/104, 109, 105, 123; 455/355, 200.1, 232.1, 233.1

[56]   References Cited

U.S. PATENT DOCUMENTS 4,363,001  12/1982  Suzuki ................................. 455/233.1
4,495,652  1/1985  Leslie ................................... 455/200.1

*Primary Examiner*—Minsun Oh Harvey
*Attorney, Agent, or Firm*—Allen, Dyer, Doppelt, Milbrath & Gilchrist, P.A.

[57]   ABSTRACT

The method of adjusting the volume and the loudness in an audio device uses a volume-control unit for attenuating an audio signal by a predetermined value and a loudness-control unit for attenuating, by a further predetermined value, every component of the audio signal when in an inactive state and only the high-frequency components when in an active state. The method includes the steps of setting a volume level, associating a first and a second attenuation value with the volume level set, attenuating the audio signal by the first value and by the second value by means of the volume-control unit and the loudness-control unit, respectively, and switching the loudness-control unit selectively between the active state and the inactive state.

22 Claims, 2 Drawing Sheets

METHOD OF ADJUSTING THE VOLUME AND THE LOUDNESS IN AN AUDIO DEVICE

FIELD OF THE INVENTION

The present invention relates to a method of adjusting the volume and the loudness in an audio device and, in particular, to such a method using a volume-control unit and a loudness-control unit connected in cascade.

BACKGROUND OF THE INVENTION

Audio devices which are used, for example, in car radios, generally allow a user to set various volume levels so as to vary the intensity of the sound produced by one of more loud-speakers connected thereto. Typically, this variation is achieved by means of a volume-control unit which attenuates (or amplifies), dependent on the volume level set, an audio signal input to the device.

These audio devices usually also allow the user to switch on (or off) a loudness effect which improves the physiological sensation produced by the sound. This effect typically includes an amplification of the low-frequency components of the audio signal by a predetermined value (the high-frequencies possibly also being amplified by a lower value) so as to compensate for the lower response of the human ear to low-frequency sounds. In some known audio devices, the loudness effect amplifies the low-frequency components of the audio signal by a value which depends on the volume level set. More particularly, the loudness effect may be accentuated for low volume levels so as to compensate for the poorer response of the human ear to low frequencies when the sound is of lower intensity.

The loudness effect is achieved by means of a loudness-control unit comprising a low-pass filter which, when the unit is in an active state, attenuates the components of the audio signal having frequencies greater than a cut-off frequency, for example, of 1 kHz by a predetermined value (possibly also attenuating the other components by a lower value). When the loudness-control unit is in an inactive state, it attenuates every component of the signal by this value. If the loudness effect is switched off by the user, the loudness-control unit is put in the inactive state and the attenuation value is set at zero (0 dB) so that it does not modify the audio signal. When the user switches on the loudness effect, the audio device obtains the amplification value for the low-frequency components corresponding to the volume level set and consequently activates the loudness-control unit so as to attenuate the high-frequency components of the audio signal by an equal value. To achieve the desired amplification effect on the low-frequency components, it is then necessary to reduce correspondingly the attenuation of the audio signal produced by the volume-control unit. Similar operations are carried out in reverse order when the user switches the loudness effect off.

A disadvantage of the known devices described above is that the control of the loudness effect is quite complex and makes fairly high processing demands on the audio device.

SUMMARY OF THE INVENTION

The object of the present invention is to overcome the aforementioned drawbacks. To achieve this object, the invention provides for a method of adjusting the volume and the loudness in an audio device including, in cascade, a volume-control unit for attenuating an audio signal by a predetermined value, and a loudness-control unit for attenuating by a further predetermined value every component of the audio signal when in an inactive state, and substantially only the high-frequency components when in an active state.

The method preferably includes the steps of setting a volume level; attenuating the audio signal by a total value corresponding to the volume level set; and switching the loudness-control unit selectively between active and inactive states. Moreover, the method also preferably includes the step of associating with the volume level set, a first and a second attenuation value the sum of which is substantially equal to the total value, and the step of attenuating is preferably implemented by attenuating the audio signal by the first value and by the second value by means of the volume-control unit and the loudness-control unit, respectively.

The method of the present invention enables the loudness effect to be switched on and off by a simple command sent to the loudness-control unit without the need for further programming steps. The control of the loudness effect is therefore quick and simple and does not overload the audio device.

BRIEF DESCRIPTION OF THE DRAWINGS

Further characteristics and advantages of the method according to the present invention will become clear from the following description of a preferred embodiment thereof, given by way of non-limiting example with reference to the appended drawings, in which.

DETAILED DESCRIPTION OF THE PREFERRED EMBODIMENTS

Figure 1:
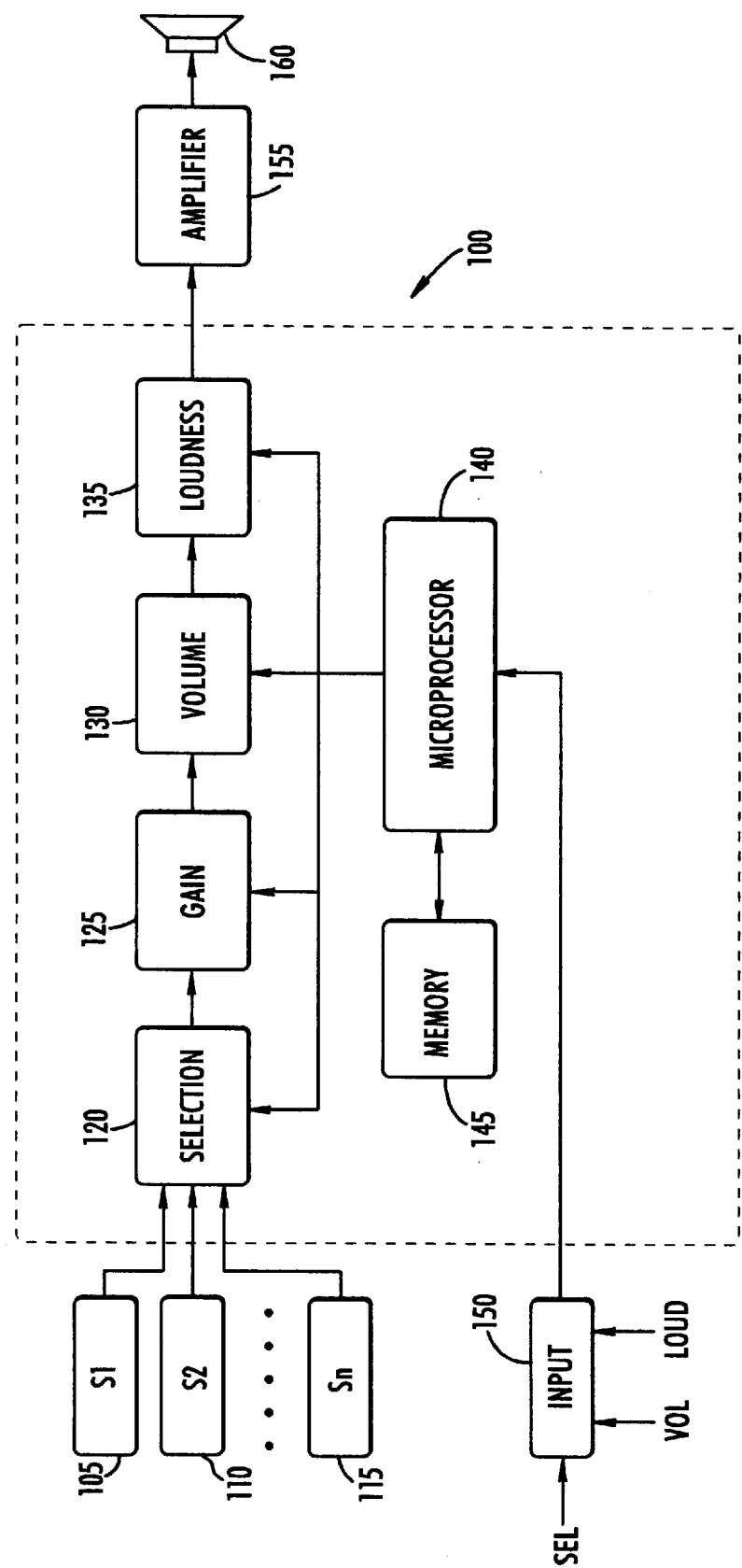
FIG. 1 shows an audio device usable for implementing the method of the present invention.

With reference now to the drawings and, in particular to FIG. 1, this shows an audio device 100 typically usable in a car radio or, alternatively, in a high-fidelity (hi-fi) system, a television set, or in other audio apparatus. The audio device 100 receives an audio input signal generated by one or more sources 105–115 such as, for example, a radio receiver, a compact-disk reader (CD), a cassette reader, or the like. The various sources 105–115 generally produce audio signals of different intensities which are equalized (as described below) by the audio device 100 so as to produce, for each source, sounds of similar intensity corresponding to a certain volume level. The sources 105–115 are connected to the input of a selection unit 120 which transfers the signal at one of its inputs to its output dependent on a suitable selection command. This audio signal is supplied to the input of a gain unit 125 for attenuating (or amplifying) the audio signal by a predetermined value, a volume-control unit 130 and a loudness-control unit 135 (described above), connected in cascade.

Alternatively, if the audio device 100 receives an input audio signal generated by only one source, the source is connected directly to the input of the units 125–135. The units 120–135 are typically included in an audio processor such as, for example, the circuit TDA7340G manufactured by SGS-Thomson Microelectronics S.r.l. For structural simplicity, the gain-control unit 125 generally has a fairly low resolution (of the order of a few dB, for example 3 dB). The volume-control unit 130 and the loudness-control unit 135, on the other hand, have a fairly high resolution on the order of 1 dB. For example, the unit 130 has a resolution of 0.31 dB with attenuation values variable between −60 dB (attenuation) and +20 dB (amplification) whereas the unit 135 provides for 16 attenuation levels separated by 1.25 dB (from 0 dB to −18.75 dB).

The audio device 100 also includes a microprocessor 140 associated with a memory 145 and controls the units 120–135 by means of suitable command signals. An input unit 150 provided, for example, on the front of the car radio, is connected to the input of the microprocessor 140 and enables a user to set a desired volume level and to switch a loudness effect on or off. If the device 100 is connected to several audio-signal sources, the input unit 150 also allows a particular source to be selected. The audio signal, pre-amplified by the units 125–135, is supplied to a final amplifier 155 which sets in operation one or more output actuators (loud-speakers) 160 which transform the electrical information received into sound waves.

Figure 2:
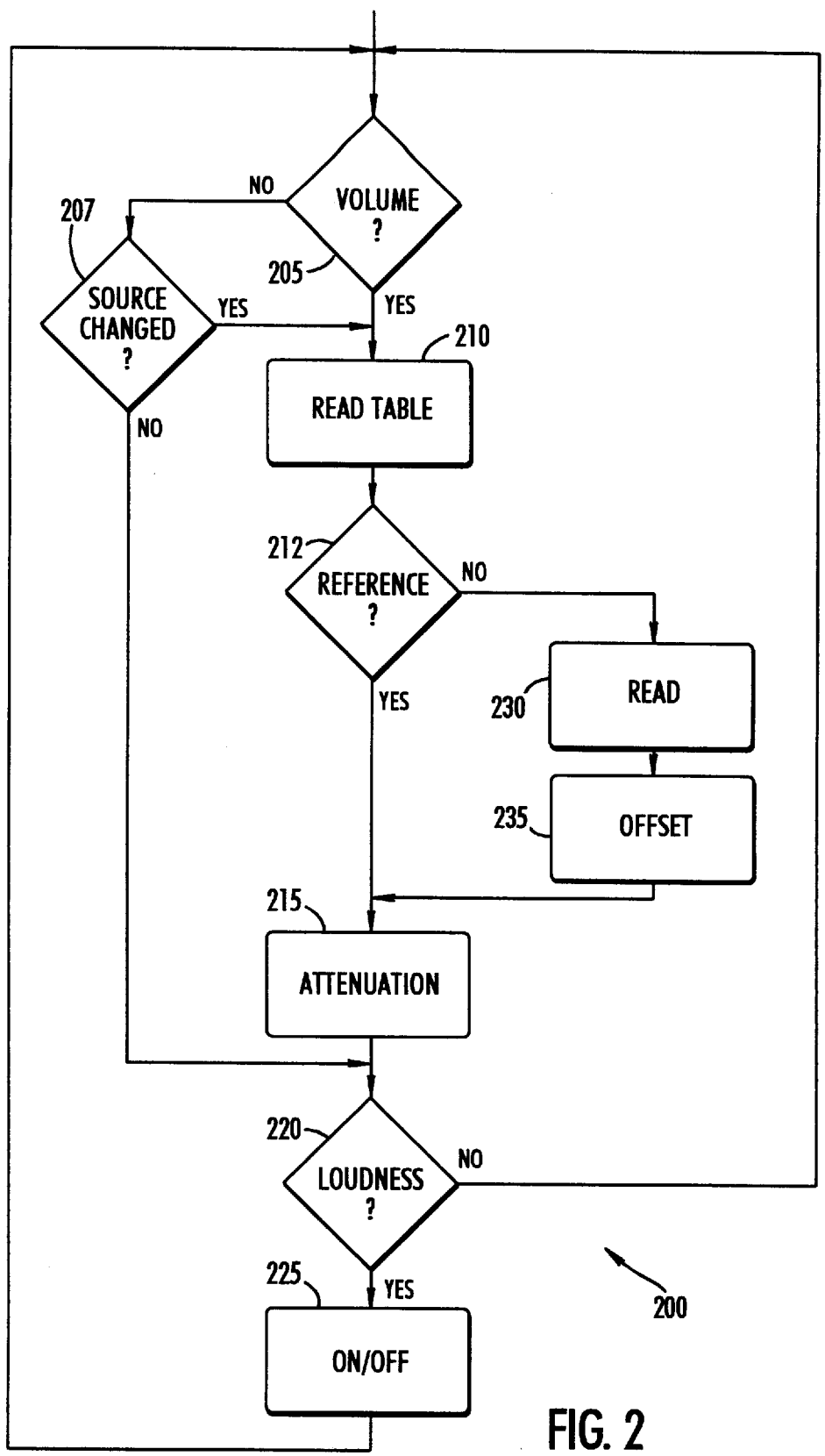
FIG. 2 is a basic flow chart of the method according to the present invention.

With reference now to FIG. 2, the method 200 of the present invention starts in block 205 in which the microprocessor 140 checks whether the user has changed the volume level set. If so, the method goes on to block 210 but if not, the microprocessor 140 checks, in block 207, whether the user has changed the audio-signal source selected. If the user has changed the source selected, the method goes on to block 210, but if not, the method goes directly to block 220.

With reference now to block 210, the microprocessor 140 associates with the volume level set an attenuation value for the volume-control unit 130 and an attenuation value for the loudness-control unit 135, the sum of which (ignoring any difference due to the different resolutions of the units 130 and 135) is practically equal to the total attenuation to be applied to the audio signal at the volume level set. This association preferably takes place by means of a table stored in the memory 145 in which two command codes to be sent to the units 130, 135 in order to achieve the desired attenuation correspond to each volume-level value. As described in detail below, this table enables the frequency-response curve of the loudness effect of the audio device 100 to be defined automatically. The loudness effect produced can therefore easily be modified simply by altering the contents of the table.

With reference now to block 212, the microprocessor 140 checks whether the audio-signal source selected is a reference source (for example, the radio receiver) for which the above-described table has been defined. If so (and always if the audio device is connected to a single audio-signal source), the method goes on to block 215 in which the microprocessor 140 attenuates the audio signal by the values obtained in step 210 by means of the units 130 and 135 (the attenuation of the gain unit 125 is set at a fixed value, for example 0 dB).

It is pointed out that, when the user makes changes in the volume level from a starting level to a new value involving considerable differences in the attenuation of the audio signal, these changes generate interference (noise) which appears as a slight click in the sound produced. In an advantageous embodiment of the present invention, the changes in the volume level are carried out by automatically setting in sequence, for a short period of time (for example a few ms), one or more intermediate volume levels between the starting level and the new level and consequently attenuating the audio signal. For example, the audio device may set all of the volume levels between the starting level and the new level, one level in every two, one in three, and so on, or intermediate levels selected on the basis of a predetermined algorithm.

In particular, it should be noted that, although the volume-control unit 130 has a fairly high resolution, for practical purposes, the number of volume levels available to the user is generally fairly limited (for example, a few tens), with corresponding changes in attenuation of the order of a few dB (for example 5 dB). In this case, even a change from one volume level to the next may generate interference in the sound produced. The above-defined table advantageously includes a larger number of volume levels than that available to the user so that each volume change can be carried out by means of smaller changes in attenuation (for example 5 changes of 1 dB) without any noise for the user. In this case, it is also possible to provide several volume profiles (for example, with linear, or stepped variation, or the like) making available to the user from the table only a few values selected in accordance with a corresponding algorithm.

With reference now to block 220, the microprocessor 140 checks whether the user has changed the loudness effect. If not, the method goes back directly to block 205 but if so, the microprocessor 140 consequently switches the loudness-control unit 135 on or off in block 225. In particular, if the loudness effect has been switched off, the loudness-control unit 135 is put in the inactive state in which it operates simply as an audio-signal attenuator. In this case, the units 130 and 135 attenuate the audio signal as a whole by a total value corresponding to the volume level set (for example −17.5 dB, of which −7.5 dB is carried out by means of the unit 130 and −10 dB by the unit 135). If the loudness effect has been switched on, the loudness-control unit is put in the active state in which it attenuates only the high-frequency components of the audio signal (by −10 dB in the example in question). In this case, the high-frequency components are kept at a level corresponding to the desired volume (−17.5 dB) while the low-frequency components are attenuated solely by the volume-control unit (by −7.5 dB) and are therefore automatically amplified by the desired value (10 dB). Upon conclusion, the method goes back to blocs 205 to repeat the control described above cyclically.

With reference again to block 212, if the audio-signal source is other than the reference source, the method goes on to block 230 in which the microprocessor 140 obtains from the memory 145 a volume offset for the source selected, relative to the reference source. Typically, the offset is set for each source by the user by means of the input unit 150. Alternatively, a detection unit (not shown in the drawings) is provided and measures the mean intensity of the audio signal corresponding to the source selected and supplies this measurement to the microprocessor 140 which thus automatically obtains the volume offset for the source by a comparison with a value corresponding to the reference source. In this case, the microprocessor 140 can also modify the volume offset of each source dynamically to keep the sound intensity constant for a given volume level set. For example, this enables medium (such as cassettes) recorded at different levels signals of different levels transmitted by radio stations, and the like, to be reproduced with the same sound intensity.

The method then goes on to block 235 in which the microprocessor 140 associates with the volume offset an attenuation value for the gain unit 125 and an attenuation offset for the volume-control unit 130, the sum of which is practically equal to the change in attenuation of the audio signal corresponding to the volume offset of the source selected. Alternatively, the microprocessor 140 also associates with the volume offset an attenuation offset for the loudness-control unit 135. This association is preferably effected by means of a further table stored in the memory 145, in which values as described above correspond to each volume-offset value.

The attenuation-offset values are added to the corresponding attenuation values for the volume-control unit 130 and for the loudness-control unit 135 obtained in block 210 for the reference source. If one of these sums has a value lower than the maximum attenuation of the corresponding unit, this maximum value is adopted as the value of the sum. It is pointed out that the equalization error thus generated appears at low volume levels so that it is practically imperceptible to the user. The method then goes on to block 215 described above. In this case, the microprocessor 140 attenuates the audio signal by means of the units 125, 130 and 135 by the values thus obtained (including any offset). This embodiment of the present invention offers the further advantage of permitting very accurate equalization of the audio-signal level without the use of any external components such as resistive dividers. In fact, it is pointed out that equalization achieved, as in known audio devices, solely by means of the gain unit 125 is somewhat imprecise because of the low resolution of this unit.

When the volume-control unit 130 (and possibly the loudness-control unit 135) is used as described above, on the contrary, greater accuracy in the equalization of the various audio-signal sources can be achieved quickly and easily. For example, if the variation in intensity of the audio signal of the source selected in comparison with the reference signal is −10 dB, this value can be obtained with a good approximation by a −9 dB (−3*3 db) attenuation by the unit 125 and a −0.93 dB (−3*0.31 dB) attenuation by the unit 130 to give a total of −9.93 dB.

Naturally, in order to satisfy contingent and specific requirements, an expert in the art may apply to the above-described method many modifications and variations all of which, however, are included within the scope of protection of the invention as defined by the following claims.

That which is claimed is:

1. A method of adjusting the volume and the loudness in an audio device comprising, in cascade, a volume-control unit for attenuating an audio signal by a predetermined value and a loudness-control unit for attenuating, by a further predetermined value, every component of the audio signal when in an inactive state and substantially only the high-frequency components when in an active state, the method comprising the steps of:

a) setting a volume level;

b) attenuating the audio signal by a total value corresponding to the volume level set and assigning to the volume level set a first and a second attenuation value a sum of which is substantially equal to the total attenuation value corresponding to the volume level set by attenuating the audio signal by the first attenuation value and by the second attenuation value by means of the volume-control unit and the loudness-control unit, respectively; and c) switching the loudness-control unit selectively between the active state and the inactive state.

2. A method according to claim 1, wherein the step of assigning is implemented by reading from a table a first code and a second code corresponding to the volume set and indicative of the first and the second attenuation values, respectively.

3. A method according to claim 2, wherein the table includes first and second codes corresponding to a set of volume levels including the volume levels which can be set.

4. A method according to claim 1, further comprising the steps of:

setting a new volume level;

attenuating the audio signal by a total value corresponding to at least one intermediate volume level included in sequence between the volume level set and the new volume level; and attenuating the audio signal by a total value corresponding to the new volume level.

5. A method according to claim 1, wherein the audio device can be connected to a plurality of audio-signal sources and wherein the audio device further comprises a gain unit for attenuating the audio signal by a still, further predetermined value, the method further comprising the steps of:

d) selecting an audio-signal source;

e) assigning to the audio-signal source selected a volume offset relative to a reference source;

f) assigning to the volume offset a third attenuation value and a first attenuation offset the sum of which is substantially equal to a total attenuation value corresponding to the volume offset, and setting the first attenuation value equal to the sum of the first attenuation value and the first offset; and g) attenuating the audio signal by the third value by means of the gain unit.

6. A method according to claim 5, wherein step f) is implemented by further assigning to the volume offset a second attenuation offset, the sum of the third attenuation value, the first offset and the second offset being substantially equal to the total attenuation corresponding to the volume offset, and setting the second attenuation value equal to the sum of the second attenuation value and the second offset.

7. A method according to claim 5, wherein step e) is implemented by measuring a mean intensity of the audio signal corresponding to the audio-signal source selected and comparing this measurement with a reference value corresponding to the reference source.

8. A method of adjusting the volume and the loudness in an audio device comprising, in cascade, a volume-control unit for attenuating an audio signal by a predetermined value and a loudness-control unit for attenuating, by a further predetermined value, every component of the audio signal when in an inactive state and substantially only the high-frequency components when in an active state, the method comprising the steps of:

a) setting a volume level;

b) attenuating the audio signal by a total value corresponding to the volume level set and assigning to the volume level set a first and a second attenuation value a sum of which is substantially equal to the total attenuation value corresponding to the volume level set by attenuating the audio signal by the first attenuation value and by the second attenuation value by means of the volume-control unit and the loudness-control unit, respectively;

c) switching the loudness-control unit selectively between the active state and the inactive state;

d) setting a new volume level;

e) attenuating the audio signal by a total value corresponding to at least one intermediate volume level included in sequence between the volume level set and the new volume level; and f) attenuating the audio signal by a total value corresponding to the new volume level.

9. A method according to claim 8, wherein the step of assigning is implemented by reading from a table a first code and a second code corresponding to the volume set and indicative of the first and the second attenuation values, respectively.

10. A method according to claim 9, wherein the table includes first and second codes corresponding to a set of volume levels including the volume levels which can be set.

11. A method according to claim 8, wherein the audio device can be connected to a plurality of audio-signal sources and wherein the audio device further comprises a gain unit for attenuating the audio signal by a still, further predetermined value, the method further comprising the steps of:

g) selecting an audio-signal source;

h) assigning to the audio-signal source selected a volume offset relative to a reference source;

i) assigning to the volume offset a third attenuation value and a first attenuation offset the sum of which is substantially equal to a total attenuation value corresponding to the volume offset, and setting the first attenuation value equal to the sum of the first attenuation value and the first offset; and j) attenuating the audio signal by the third value by means of the gain unit.

12. A method according to claim 11, wherein step h) is implemented by further assigning to the volume offset a second attenuation offset, the sum of the third attenuation value, the first offset and the second offset being substantially equal to the total attenuation corresponding to the volume offset, and setting the second attenuation value equal to the sum of the second attenuation value and the second offset.

13. A method according to claim 12, wherein step g) is implemented by measuring a mean intensity of the audio signal corresponding to the audio-signal source selected and comparing this measurement with a reference value corresponding to the reference source.

14. A method of adjusting the volume and the loudness in an audio device comprising, in cascade, a volume-control unit for attenuating an audio signal by a predetermined value and a loudness-control unit for attenuating, by a further predetermined value, every component of the audio signal when in an inactive state and substantially only the high-frequency components when in an active state, the audio device being connectable to a plurality of audio-signal sources and wherein the audio device further comprises a gain unit for attenuating the audio signal by a still further predetermined value, the method comprising the steps of:

a) setting a volume level;

b) attenuating the audio signal by a total value corresponding to the volume level set and assigning to the volume level set a first and a second attenuation value a sum of which is substantially equal to the total value corresponding to the volume level set by attenuating the audio signal by the first attenuation value and by the second attenuation value by means of the volume-control unit and the loudness-control unit, respectively;

c) switching the loudness-control unit selectively between the active state and the inactive state;

d) selecting an audio-signal source;

e) assigning to the audio-signal source selected a volume offset relative to a reference source;

f) assigning to the volume offset a third attenuation value and a first attenuation offset the sum of which is substantially equal to a total attenuation value corresponding to the volume offset, and setting the first attenuation value equal to the sum of the first attenuation value and the first offset; and g) attenuating the audio signal by the third value by means of the gain unit.

15. A method according to claim 14, wherein the step of assigning is implemented by reading from a table a first code and a second code corresponding to the volume set and indicative of the first and the second attenuation values, respectively.

16. A method according to claim 15, wherein the table includes first and second codes corresponding to a set of volume levels including the volume levels which can be set.

17. A method according to claim 14, wherein step f) is implemented by further assigning to the volume offset a second attenuation offset, the sum of the third attenuation value, the first offset and the second offset being substantially equal to the total attenuation corresponding to the volume offset, and setting the second attenuation value equal to the sum of the second attenuation value and the second offset.

18. A method according to claim 14, wherein step e) is implemented by measuring a mean intensity of the audio signal corresponding to the audio-signal source selected and comparing this measurement with a reference value corresponding to the reference source.

19. An audio apparatus comprising:

a volume-control unit for attenuating an audio signal by a predetermined value;

a loudness-control unit, connected in cascade with said volume-control unit, which can be switched selectively between an inactive state and an active state in which states it attenuates every component of the audio signal and substantially only the high-frequency components, respectively, by a further predetermined value;

input means for setting a volume level and for switching the loudness-control unit;

means for assigning to the volume level set a first and a second attenuation value the sum of which is substantially equal to a total attenuation value corresponding to the volume level set; and logic means for attenuating the audio signal by the first attenuation value and by the second attenuation value by means of the volume-control unit and the loudness-control unit, respectively.

20. An audio apparatus according to claim 19, wherein the audio apparatus can be connected to a plurality of audio-signal sources; and further comprising a gain unit for attenuating the audio signal by a still further predetermined value; wherein the input means is also able to select a source; wherein the association means is also able to associate with the source selected a volume offset relative to a reference source, and with the volume offset a third attenuation value and a first attenuation offset the sum of which is substantially equal to a total attenuation value corresponding to the volume offset; and wherein the logic means is also able to set the first attenuation value equal to the sum of the first value and the firs t offset and to attenuate the audio signal by the third value by means of the gain unit.

21. An audio apparatus according to claim 19 further comprising an amplifier connected downstream from said loudness-control unit for receiving a pre-amplified audio signal therefrom and for outputting an amplified audio signal to be sent to at least one loud-speaker.

22. An audio apparatus according to claim 19 further comprising a radio receiver so that the apparatus is a car radio.

* * * * *